(12) United States Patent
Pidwerbecki et al.

(10) Patent No.: US 9,765,439 B2
(45) Date of Patent: Sep. 19, 2017

(54) ELECTROPLATED PLASTIC CHASSIS FOR ELECTRONIC DEVICE

(71) Applicant: Intel Corporation, Santa Clara, CA (US)

(72) Inventors: David Pidwerbecki, Hillsboro, OR (US); Mark E. Sprenger, Folsom, CA (US); Songnan Yang, San Jose, CA (US); Kwan Ho X. Lee, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 14/499,172

(22) Filed: Sep. 27, 2014

(65) Prior Publication Data

US 2016/0095229 A1   Mar. 31, 2016

(51) Int. Cl.
| | |
|---|---|
| *H01Q 7/00* | (2006.01) |
| *C25D 7/00* | (2006.01) |
| *H05K 1/02* | (2006.01) |
| *H05K 1/16* | (2006.01) |
| *H05K 3/00* | (2006.01) |
| *H05K 3/18* | (2006.01) |
| *C25D 5/02* | (2006.01) |
| *C25D 5/10* | (2006.01) |
| *C25D 5/48* | (2006.01) |

(52) U.S. Cl.
CPC ............... *C25D 7/00* (2013.01); *C25D 5/022* (2013.01); *C25D 5/10* (2013.01); *C25D 5/48* (2013.01); *H05K 1/0284* (2013.01); *H05K 1/16* (2013.01); *H05K 3/0014* (2013.01); *H05K 3/18* (2013.01); *H05K 2201/0999* (2013.01); *H05K 2201/09118* (2013.01); *H05K 2201/10098* (2013.01); *H05K 2201/10151* (2013.01); *H05K 2203/0723* (2013.01)

(58) Field of Classification Search
CPC ........ H05K 3/0014; H05K 3/18; H05K 3/188; H05K 1/16; H05K 1/0284; H05K 1/0353; C25D 7/00; H01Q 9/0407; H01Q 21/065; H01Q 1/38
See application file for complete search history.

(56) References Cited

U.S. PATENT DOCUMENTS

| | | | | |
|---|---|---|---|---|
| 2006/0017616 | A1* | 1/2006 | Hsu | H01Q 1/38 343/700 MS |
| 2008/0259416 | A1* | 10/2008 | Peters | G02B 5/18 359/2 |
| 2009/0121964 | A1* | 5/2009 | Yamada | H01Q 1/2225 343/866 |
| 2013/0300618 | A1* | 11/2013 | Yarga | H01Q 1/243 343/720 |
| 2014/0022720 | A1 | 1/2014 | Davison et al. | |

(Continued)

*Primary Examiner* — Steven T Sawyer
(74) *Attorney, Agent, or Firm* — Alpine Technology Law Group LLC

(57) ABSTRACT

In one example an electronic device comprises a controller and a chassis comprising a polymer layer, a first metallic layer deposited on a first side of the polymer layer, and a second metallic layer deposited on a second side of the polymer layer, wherein at least one of the first metallic layer or the second metallic layer comprises an electrically functional integrated structure. Other examples may be described.

8 Claims, 8 Drawing Sheets

(56) References Cited

U.S. PATENT DOCUMENTS

2014/0266917 A1* 9/2014 De Luis ............... H01Q 19/005
   343/700 MS
2015/0255872 A1* 9/2015 Hasumuro ........... H01Q 9/0407
   455/456.1

* cited by examiner

US 9,765,439 B2

ELECTROPLATED PLASTIC CHASSIS FOR ELECTRONIC DEVICE

RELATED APPLICATIONS

None.

BACKGROUND

The subject matter described herein relates generally to the field of electronic devices and more particularly to a electroplated plastic chassis for electronic devices.

Design trends for electronic devices such as laptop computers, notebook computers, tablet devices, and the like are driving thinner, low-cost devices with high-quality finishes. Existing techniques for manufacturing chassis components for electronic devices are reaching practical limits in obtaining thin components. Accordingly additional techniques to manufacture electronic device chassis components may find utility.

BRIEF DESCRIPTION OF THE DRAWINGS

The detailed description is described with reference to the accompanying figures.

DETAILED DESCRIPTION

Described herein are exemplary systems and methods to manufacture electroplated plastic chassis components in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to provide electroplated plastic chassis components for electronic device displays, and more chassis components which may incorporate integrated components such as antennas, identifiers devices, and the like. In some examples, the subject matter described herein addresses these and other issues by providing a chassis for an electronic device comprising a polymer layer, a first metallic layer deposited on a first side of the polymer layer and a second metallic layer deposited on a second side of the polymer layer. At least one of the first metallic layer or the second metallic layer comprises an integrated antenna structure, other electronic structure, structural enhancements (power transmission cables, strip lines, coaxial cables windows for sensors, power connectors and may include additional features.

Further structural and operational details will be described with reference to FIGS. 1-10, below.

Figure 1:
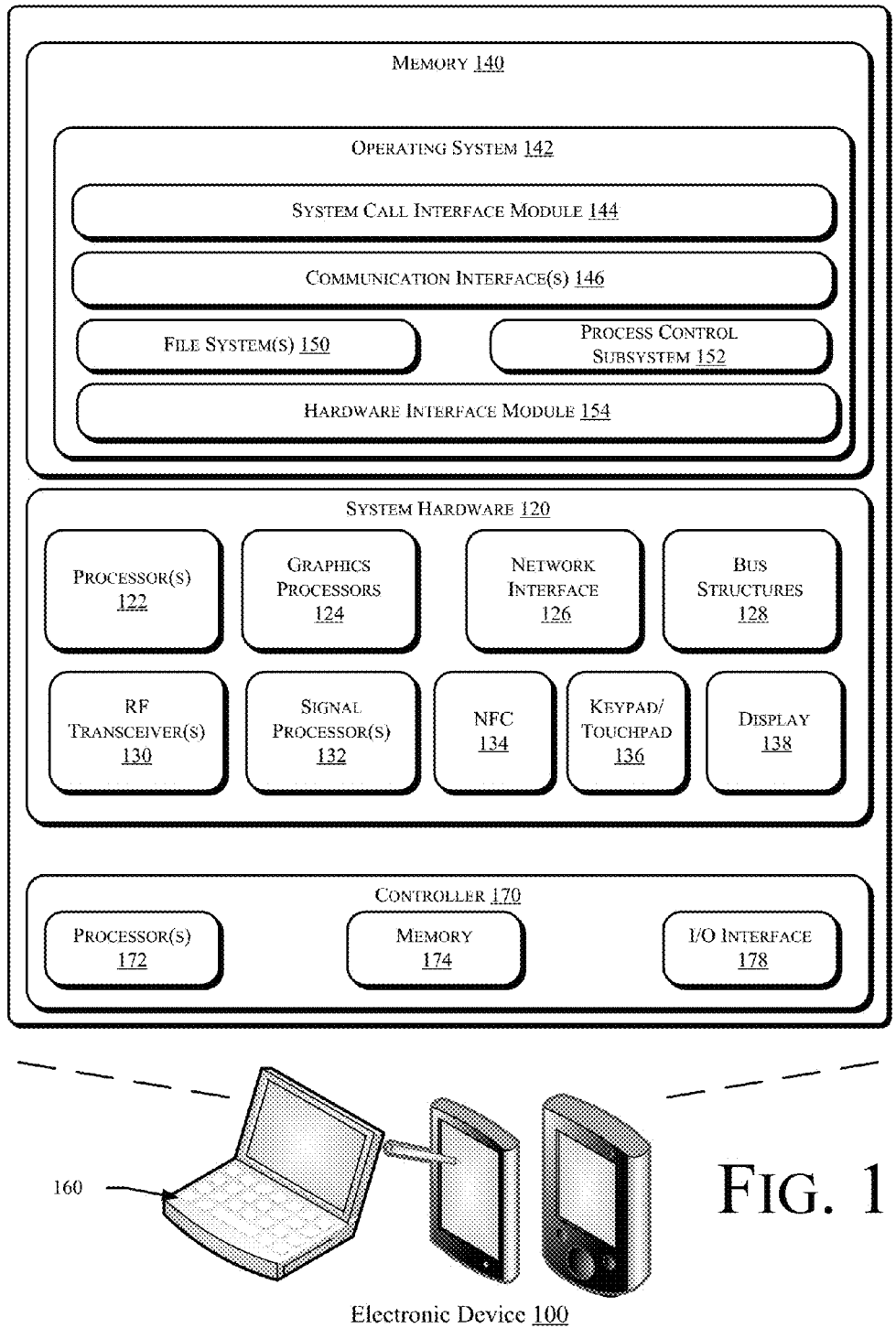
FIG. 1 is a schematic illustration of an electronic device which may be adapted to implement a electroplated plastic chassis in accordance with some examples.

FIG. 1 is a schematic illustration of an electronic device 100 which may be adapted to implement an electroplated plastic chassis 164 in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one example, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one example, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one example, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more input/output interfaces such as, e.g., a keypad 136 and a display 138. In some examples electronic device 100 may not have a keypad and use the touch panel for input.

Memory 140 may include an operating system 142 for managing operations of electronic device 100. In one example, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms In the example depicted in FIG. 1 the controller 170 comprises a processor 172, a memory module 174, and an I/O interface 178. In some examples the memory module 174 may comprise a persistent flash memory module and the various functional modules may be implemented as logic instructions encoded in the persistent memory module, e.g., firmware or software. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122.

Figure 2A:
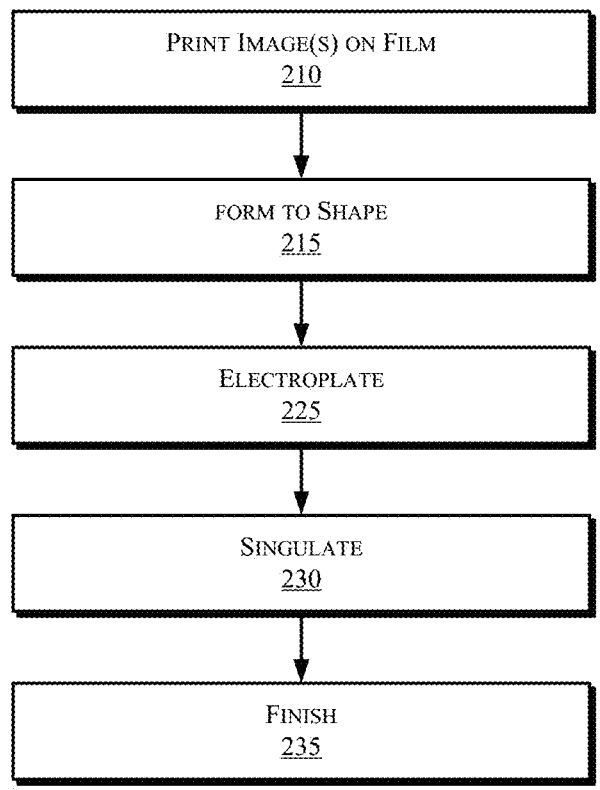
FIGS. 2A and 2B are flowcharts illustrating operations in a method to make an electroplated plastic chassis for an electronic device in accordance with some examples.
Figure 2B:
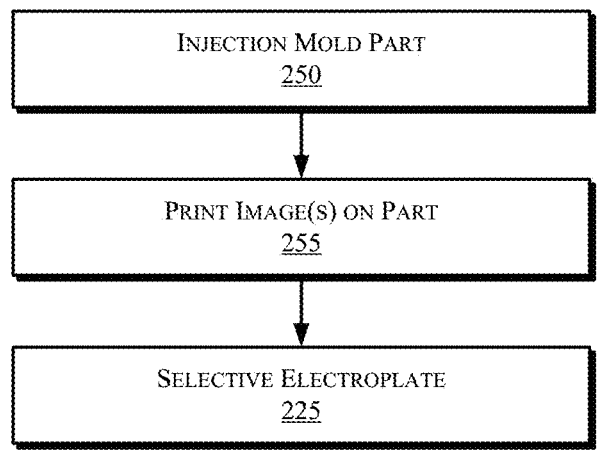
Figure 3:
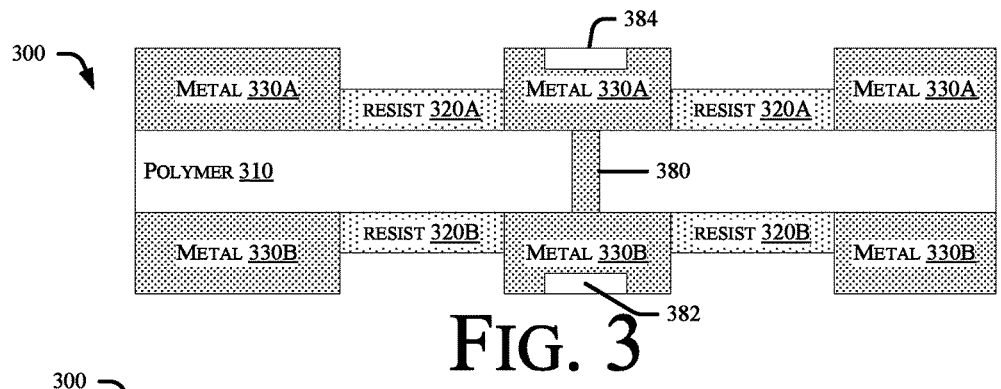
FIG. 3 is a schematic illustration of a side view of an electroplated plastic chassis for an electronic device in accordance with some examples.

FIGS. 2A and 2B are flowcharts illustrating operations in methods to make an electroplated plastic chassis for an electronic device in accordance with some examples, and FIG. 3 is a schematic illustration of a side view of an electroplated plastic chassis for an electronic device in accordance with some examples. Referring to FIGS. 2A-2B and 3, in a first method an image is screen printed on a polymer film. In some examples the polymer 310 may be formed from a relatively thin (e.g., having a thickness between 0.05 millimeters and 1.0 millimeters) sheet of thermoformable plastic film and the sheet may be formed using a conventional thermoforming process. The printing operation may utilize screen print techniques (e.g., ink jet print, pad print, etc.) to print an image on one or both sides of the polymer film using a paint/resist that can survive an electroplating process and that is selective to the electroplating process to form In some examples the printing material may comprise a resist screen printing paint which may be used to form patterns on the surface of the polymer material, as described below. Other methods of patterning the polymer material can include inkjet printing, gravure printing, pad printing, etc.

At operation 215 the polymer 310 is formed to a desired shape. In some examples a thermoforming operation may be used to form the polymer.

At operation 220 the polymer film 330 is electroplated to form a first metallic layer 330A on a first side of polymer 310 and second metallic layer 330B on a second side of polymer 310. The electroplating operation can be performed in one or more electroplating process steps. For example, the metallization can be done multiple times with different plating materials, etc. This may require multiple etches, rinses, and different metals to be electroplated. The electroplating operation may involve a process that accommodates selective plating of the film and does not overplate the resist layer 320.

At operation 230 the electroplated parts are singulated (i.e., trimmed or diced) from the sheet 310, and at operation 235 the electroplated parts are finished, which may include selective removal of electroplating to insure electrical isolation of components formed during the process.

FIG. 2B depicts a second method which may be useful with an injection molded part. Referring to FIG. 2B, at operation 250 a part is injection molded from a polymer material that is capable of being electroplated. At operation 255 images are printed on one or both sides of the polymer using a paint/resist that can survive the electroplating bath chemistries and is selective to the electroplating process. As described above, The electroplating operation can be performed in one or more electroplating process steps. For example, the metallization can be done multiple times with different plating materials, etc. This may require multiple etches, rinses, and different metals to be electroplated. The electroplating operation may involve a process that accommodates selective plating of the film and does not overplate the resist layer(s) 320.

At operation 260 the part is electroplated to selectively electroplate metals onto the polymer materials. For example, an electrical connection between the chassis and the electronic structures patterned on the chassis will be completed by pogo pins, but other methods are acceptable.

Figure 4:
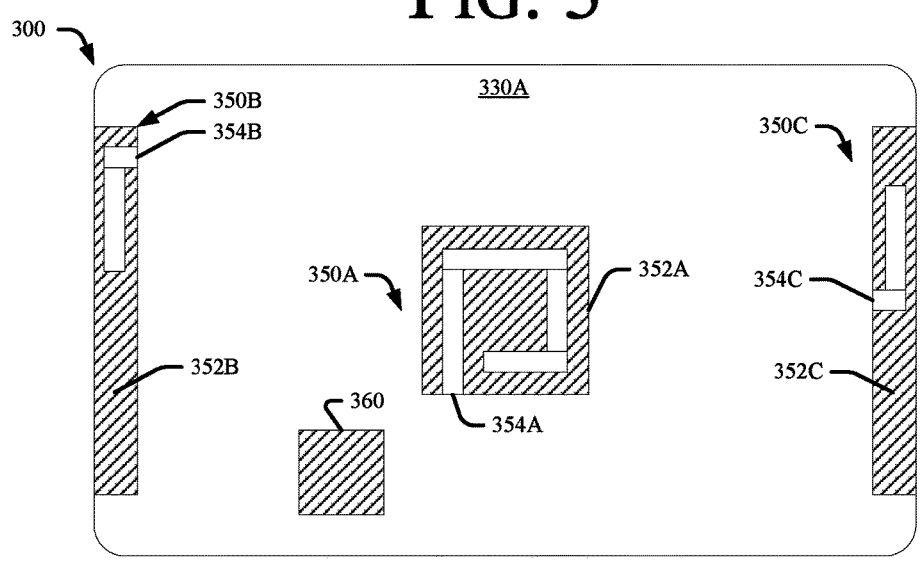
FIG. 4 is a schematic illustration of a first side of an electroplated plastic chassis for an electronic device in accordance with some examples.

In some examples the methods described herein may be used to form patterns on one or both sides of the polymer layer 310 such that the electroplating operation(s) result in metallized patterns on the polymer 310. FIG. 4 is a schematic illustration of a first side of an electroplated plastic chassis 300 for an electronic device in accordance with some examples. Referring to FIG. 4, in some examples the resist layer 320A may be applied such that the metallic layer 330A forms one or more integrated antenna structures 350A, 350B, 350C, which may be referred to collectively herein by reference numeral 350. For example, the resist layer 320A may be applied to define one or more patches 352A, 352B, 352C, which may be referred to collectively herein by reference numeral 352, which are not coated with metal during the electroplating operations 225, 230. The patches 352 may be of different shapes and sizes and may be located anywhere on the first metallic layer 330A.

The resist layer 320A may also be patterned to define one or more conductive strips 354A, 354B, 354C, which may be referred to collectively herein by reference numeral 354, within the respective patches 352A, 352B, 352C. The conductive strips 354 are resonant within patches 352 to define antenna structures 350. Further, conductive strips 354 are electrically coupled to the metallic layer 330, such that the entire metallic layer 330A is capable of functioning as a ground plane for the antenna structures 350. The patches 352 may be of different shapes and sizes and may be located anywhere on the first metallic layer 330A and the conductive strips 354 may be designed in a wide variety of shapes and sizes to provide a high degree of flexibility in antenna designs that can be integrated into the first metallic layer 330A.

In some examples the resist layer 320A may also be patterned to define one or more identification devices 360. For example, identification devices may include optical devices visible to the naked human eye such as logos, etchings, or the like or may include electronic components such as radio frequency identification (RFID) tags or the like.

Figure 5:
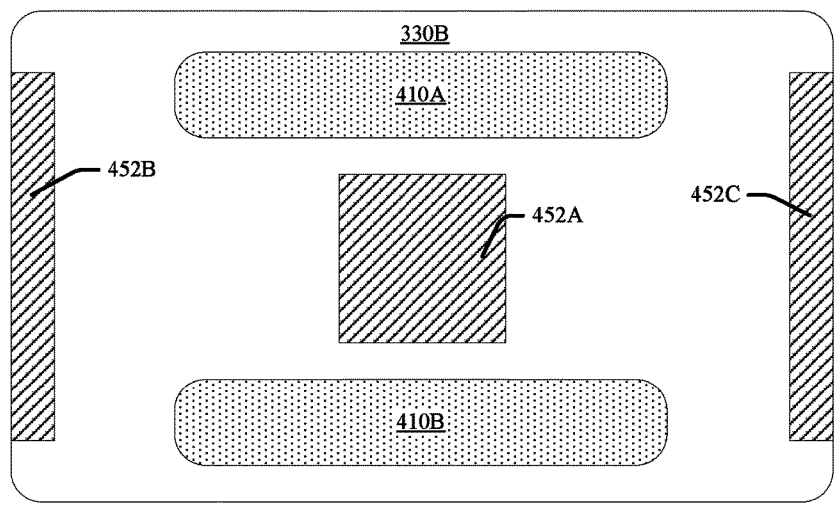
FIG. 5 is a schematic illustration of a second side of an electroplated plastic chassis for an electronic device in accordance with some examples.

FIG. 5 is a schematic illustration of a second side of an electroplated plastic chassis 300 for an electronic device in accordance with some examples. Referring to FIG. 5, in some examples the resist layer 320A may be applied such that the metallic layer 330B forms one or more regions 410A, 410B, which may be referred to collectively herein by reference numeral 410, patterned with pinholes to provide a textured surface or provide other cosmetic features on the second metallic layer 330B. Further, example, the resist layer 320B may be applied to define one or more patches 452A, 452B, 452C, which may be referred to collectively herein by reference numeral 452, which are not coated with metal during the electroplating operations 225, 230. The patches 452A, 452B, 452C may be of different shapes and sizes and may be located on the second metallic layer 330B in a position to correspond to the patches 352A, 352B, 352C, such that the patches 452A, 452B, 452C provide windows through which electromagnetic radiation from antenna structures 350A, 350B, 350C may be transmitted. The patches 452 can also be used to enhance the power dissipated from the electronic device. The patches 452 may be formed with a black surface which radiates energy more effectively than a reflective metal surface. A plastic surface can support a higher surface temperature at the same level of perceived comfort to a user. Studies demonstrate that plastic surfaces at 50 C have the same perceived hotness as metal surfaces at 43 C. Higher temperature surfaces allow for higher power (and performance) systems with metal cosmetics and localized resist coated plastic hot spots to be perceived as more comfortable by the user.

Referring briefly back to FIG. 3, in some examples a via structure 380 may be formed through the various layers of the chassis 300. For example, the first resist layer 320A may define a first aperture in the first metallic layer 330A on the first side of the polymer 310 and the second resist layer 320B may define a second aperture in the second metallic layer 330B on the second side of the polymer layer opposite the first aperture.

In some examples a drilling or other material removal operation may be used to form a hole in the polymer 310 to define a via 380 which provides a conductive path is formed between opposing surfaces of the first metallic layer 330A and the second metallic layer 330B. A touch pad 382 disposed on the second side of the polymer layer 310 and a capacitive sensor 384 may be disposed on the first side of the polymer layer 310 and coupled to the touch pad via a conductive trace extending through the via 380.

Figure 6:
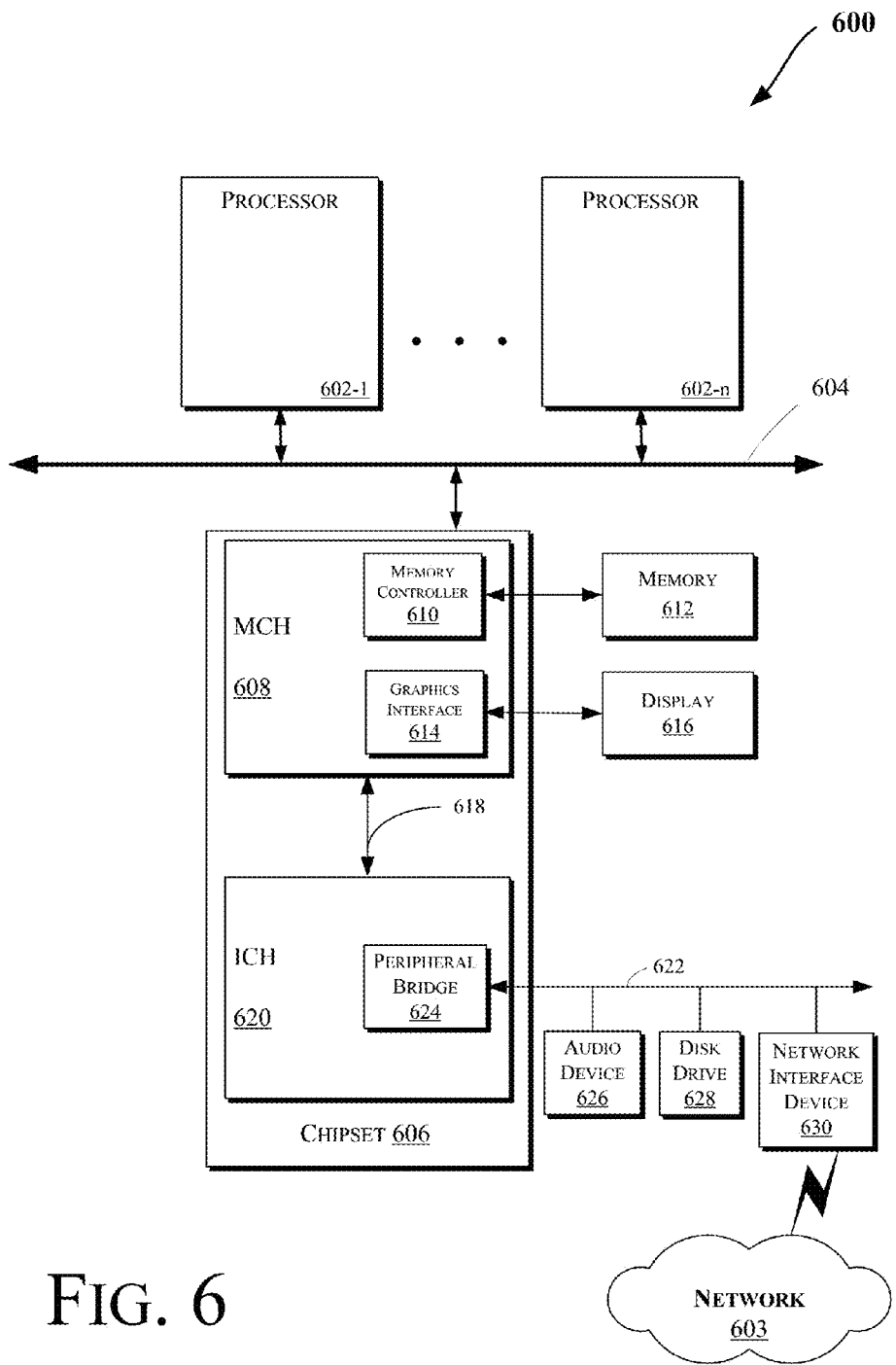
FIGS. 6-10 are schematic illustrations of electronic devices which may be adapted to implement a electroplated plastic chassis in accordance with some examples.

As described above, in some examples the electronic device may be embodied as a computer system. FIG. 6 illustrates a block diagram of a computing system 600 in accordance with an example. The computing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
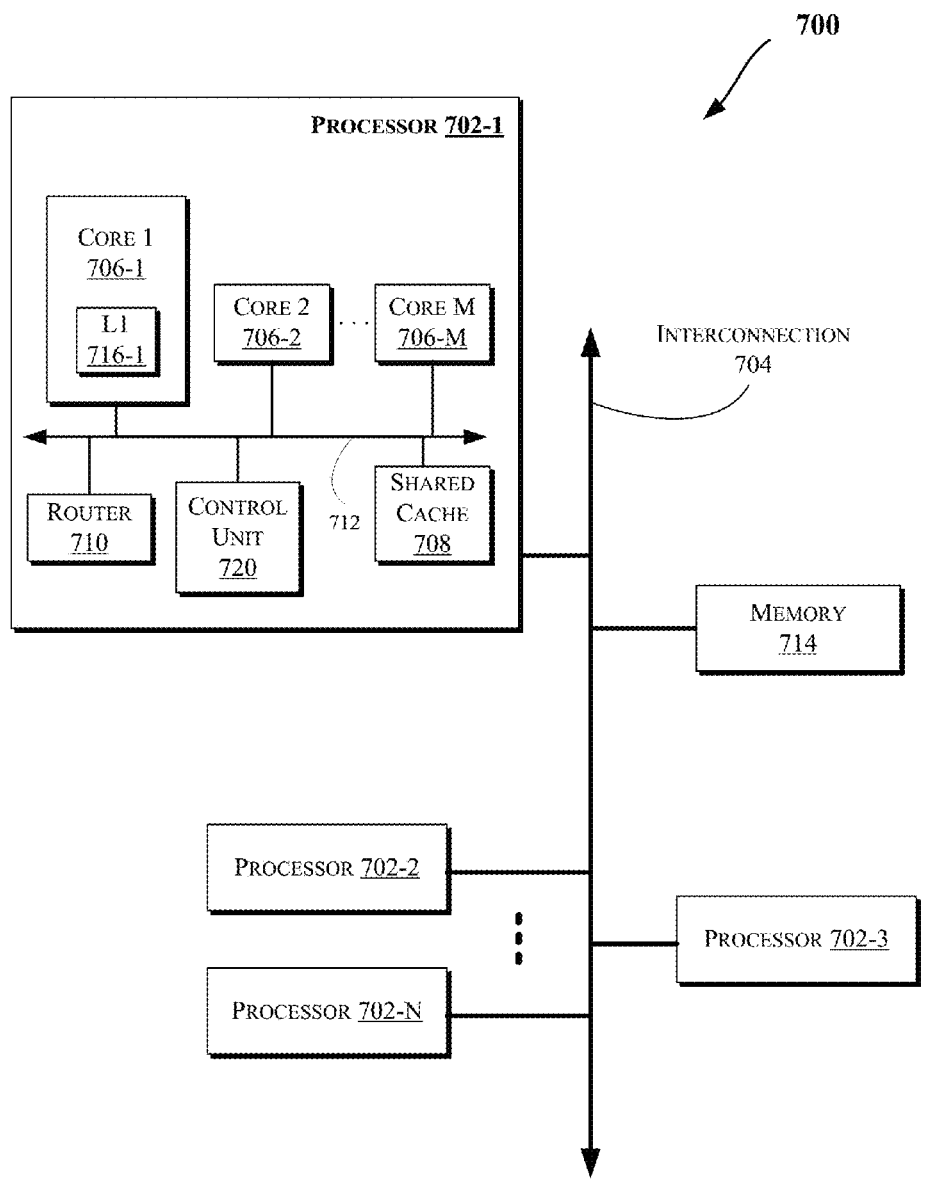

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716"). In one example, the control unit 720 may include logic to implement the operations described above with reference to the memory controller 122 in FIG. 2.

Figure 8:
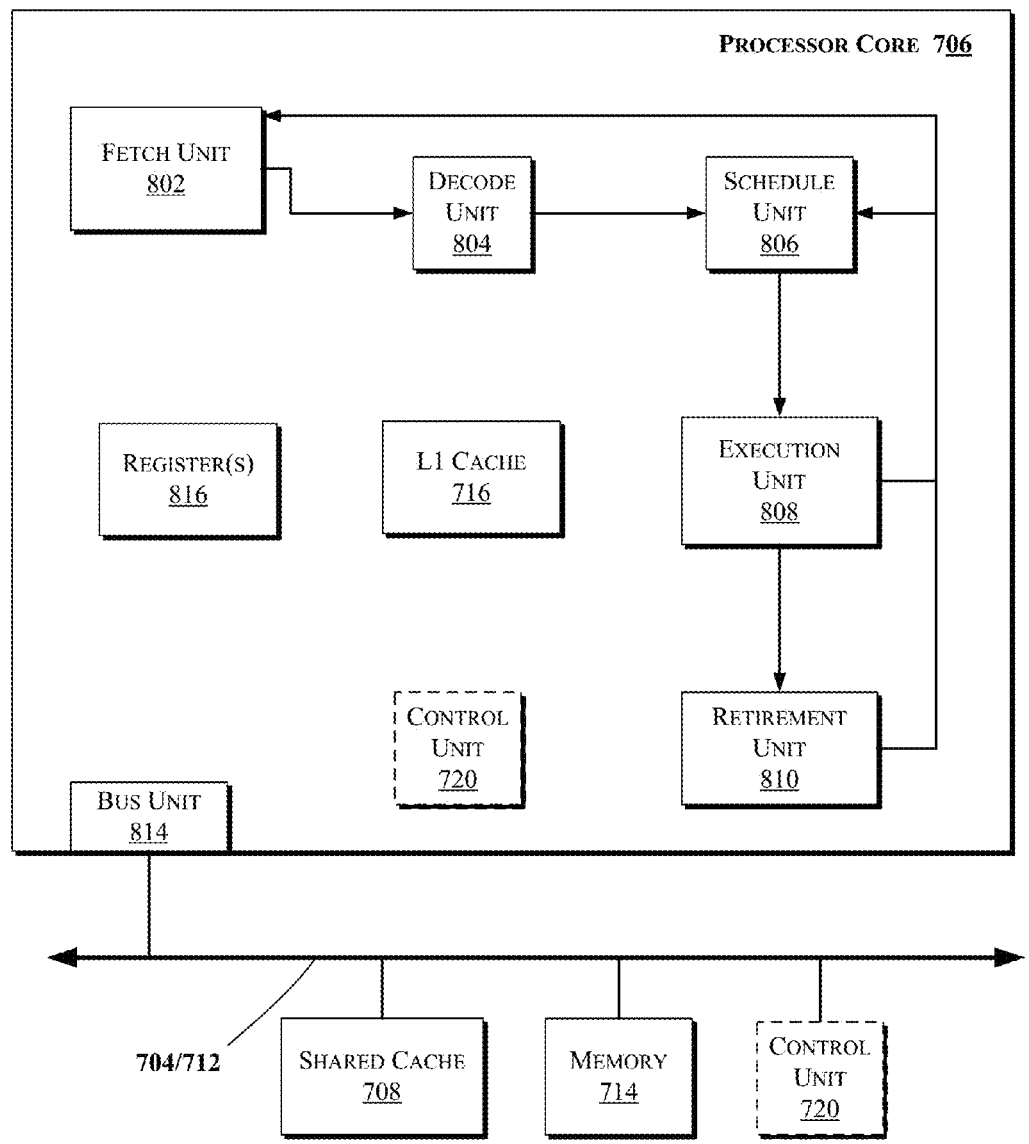

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
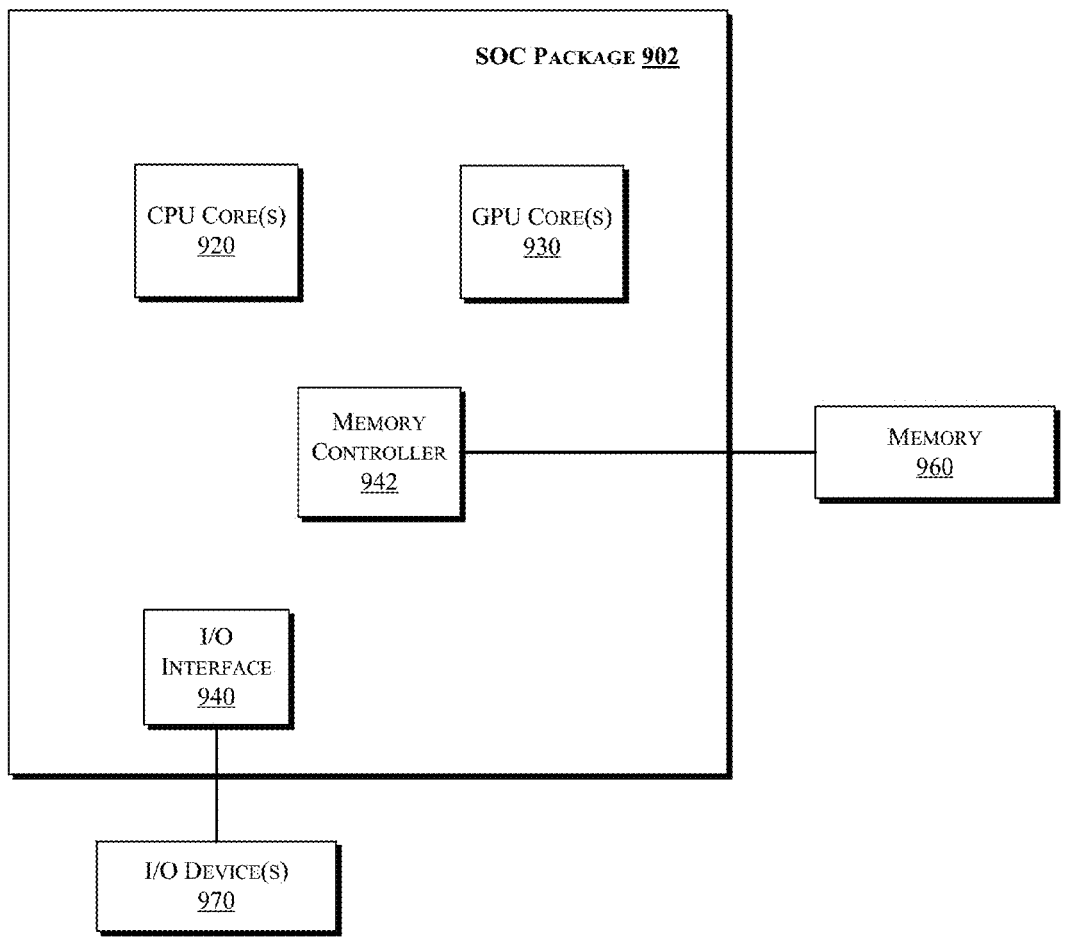

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
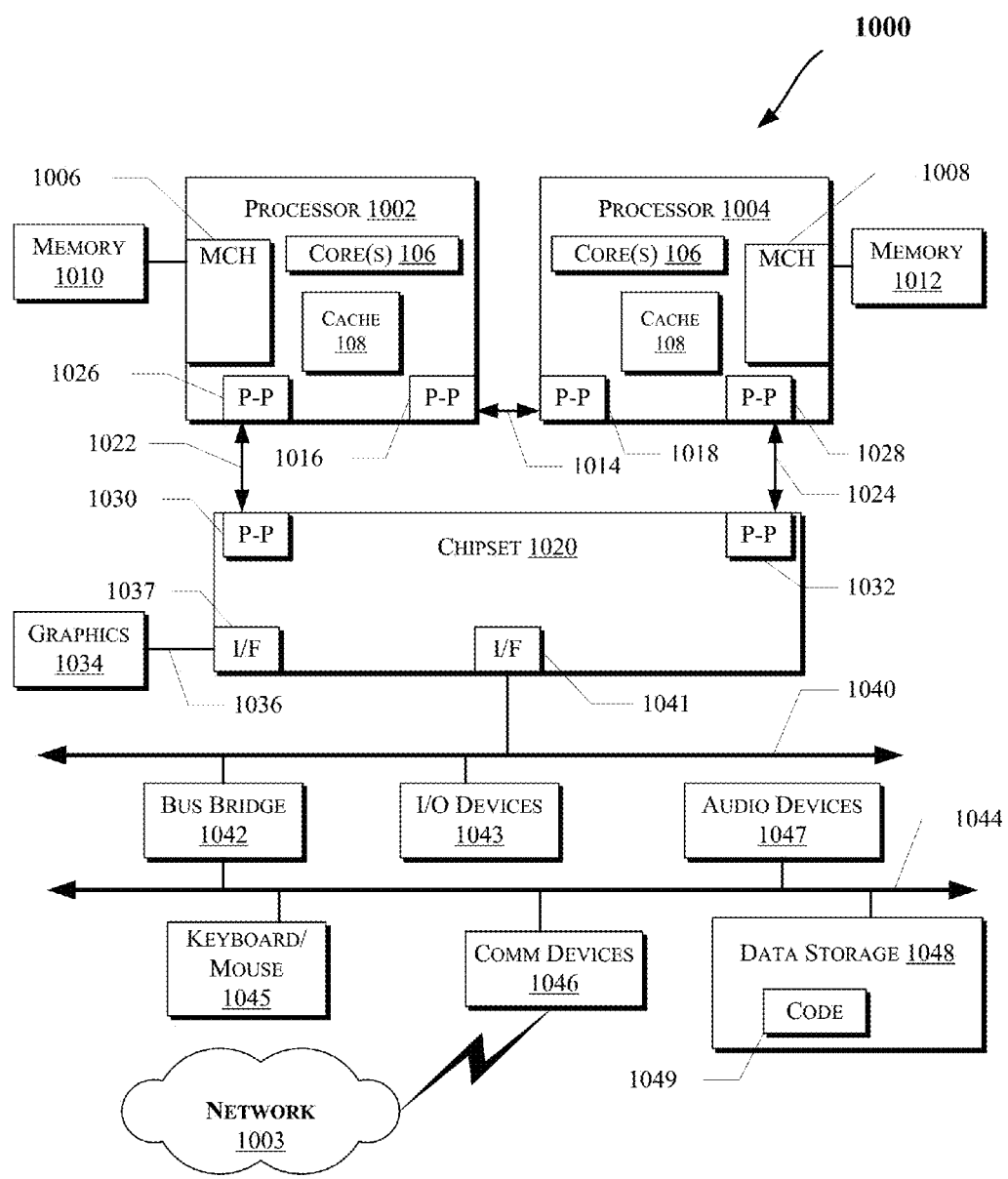

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some examples.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following pertains to further examples.

Example 1 is a chassis for an electronic device comprising a polymer layer, a first metallic layer deposited on a first side of the polymer layer; and a second metallic layer deposited on a second side of the polymer layer; wherein at least one of the first metallic layer or the second metallic layer comprises an electrically functional integrated structure.

In Example 2, the subject matter of Example 1 can optionally include an arrangement in which the electrically functional integrated structure comprises at least one of an integrated antenna structure an integrated electronic sensing structure power transmission structure; or an integrated RF window.

In Example 3, the subject matter of any one of Examples 1-2 can optionally include an arrangement in which the polymer layer comprises a formable polymer formed into a three-dimensional shape.

In Example 4, the subject matter of any one of Examples 1-3 can optionally include a first electroplating resist layer applied to at least portions of the first side of the polymer layer and a second electroplating resist layer applied to at least portions of the second side of the polymer layer.

In Example 5, the subject matter of any one of Examples 1-4 can optionally include an arrangement in which the first resist layer defines at least one antenna structure on the first side of the polymer layer; and the second resist layer defines at least one antenna window structure on the second side of the polymer layer, opposite the antenna structure.

In Example 6, the subject matter of any one of Examples 1-5 can optionally include an arrangement in which the at least one antenna structure is electrically coupled to the first metallic layer, such that the first metallic layer defines a ground plane for the at least one antenna structure.

In Example 7, the subject matter of any one of Examples 1-6 can optionally include an arrangement in which the first resist layer defines at least one identification device on the first side of the polymer layer.

In Example 8, the subject matter of any one of Examples 1-7 can optionally include an arrangement in which the first resist layer defines a first aperture in the first metallic layer on the first side of the polymer layer, the second resist layer defines a second aperture in the second metallic layer on the second side of the polymer layer, wherein the second aperture is opposite the first aperture; and the polymer layer comprises a third aperture in alignment with the first aperture and the second aperture to define a via through the chassis.

In Example 9, the subject matter of any one of Examples 1-8 can optionally include a touch pad disposed on the second side of the polymer layer; and a capacitive sensor disposed on the first side of the polymer layer and coupled to the touch pad via a conductive trace extending through the via.

Example 10 is a an electronic device, comprising a controller and a chassis for an electronic device comprising a polymer layer, a first metallic layer deposited on a first side of the polymer layer; and a second metallic layer deposited on a second side of the polymer layer; wherein at least one of the first metallic layer or the second metallic layer comprises an electrically functional integrated structure.

In Example 11, the subject matter of Example 10 can optionally include an arrangement in which the electrically functional integrated structure comprises at least one of an integrated antenna structure an integrated electronic sensing structure power transmission structure; or an integrated RF window.

In Example 12, the subject matter of any one of Examples 10-11 can optionally include an arrangement in which the polymer layer comprises a formable polymer formed into a three-dimensional shape.

In Example 13, the subject matter of any one of Examples 10-12 can optionally include a first electroplating resist layer applied to at least portions of the first side of the polymer layer and a second electroplating resist layer applied to at least portions of the second side of the polymer layer.

In Example 14, the subject matter of any one of Examples 10-13 can optionally include an arrangement in which the first resist layer defines at least one antenna structure on the first side of the polymer layer; and the second resist layer defines at least one antenna window structure on the second side of the polymer layer, opposite the antenna structure.

In Example 15, the subject matter of any one of Examples 10-14 can optionally include an arrangement in which the at least one antenna structure is electrically coupled to the first metallic layer, such that the first metallic layer defines a ground plane for the at least one antenna structure.

In Example 16, the subject matter of any one of Examples 10-15 can optionally include an arrangement in which the first resist layer defines at least one identification device on the first side of the polymer layer.

In Example 17, the subject matter of any one of Examples 10-16 can optionally include an arrangement in which the first resist layer defines a first aperture in the first metallic layer on the first side of the polymer layer, the second resist layer defines a second aperture in the second metallic layer on the second side of the polymer layer, wherein the second aperture is opposite the first aperture; and the polymer layer comprises a third aperture in alignment with the first aperture and the second aperture to define a via through the chassis.

In Example 18, the subject matter of any one of Examples 10-17 can optionally include a touch pad disposed on the second side of the polymer layer; and a capacitive sensor disposed on the first side of the polymer layer and coupled to the touch pad via a conductive trace extending through the via.

Example 19 is a method to manufacture a chassis for an electronic device, comprising forming a polymer into a three-dimensional shape, applying a first resist layer to a first side of the polymer, applying a second resist layer to a second side of the polymer, electroplating a first metallic layer on the first side of the polymer, electroplating a second metallic layer on the second side of the polymer, wherein at least one of the first metallic layer or the second metallic layer comprises an electrically functional integrated structure.

In example 20, the subject matter of Example 19 can optionally include an arrangement in which the electrically functional integrated structure comprises at least one of an integrated antenna structure an integrated electronic sensing structure power transmission structure; or an integrated RF window.

In Example 21, the subject matter of any one of Examples 19-20 can optionally include an arrangement in which the first resist layer defines at least one antenna structure on the first side of the polymer layer; and the second resist layer defines at least one antenna window structure on the second side of the polymer layer, opposite the antenna structure.

In Example 23 the subject matter of any one of Examples 19-22 can optionally include an arrangement in which the first resist layer defines at least one identification device on the first side of the polymer layer.

In Example 24, the subject matter of any one of Examples 19-23 can optionally include an arrangement in which the first resist layer defines a first aperture in the first metallic layer on the first side of the polymer layer, the second resist layer defines a second aperture in the second metallic layer on the second side of the polymer layer, wherein the second aperture is opposite the first aperture; and the polymer layer comprises a third aperture in alignment with the first aperture and the second aperture to define a via through the chassis.

In Example 25, the subject matter of any one of Examples 19-24 can optionally include a touch pad disposed on the second side of the polymer layer; and a capacitive sensor disposed on the first side of the polymer layer and coupled to the touch pad via a conductive trace extending through the via.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A chassis for an electronic device, comprising:
a polymer layer;
a first metallic layer deposited on a first side of the polymer layer; and
a second metallic layer deposited on a second side of the polymer layer;
wherein the first metallic layer or the second metallic layer comprises:
  a patch section that is not coated with a metallic layer; and
  at least one conductive strip defined within the patch section to define an antenna structure, wherein the at least one conductive strip is electrically coupled to the first metallic layer such that the first metallic layer functions as a ground plane for the antenna structure;
a first resist layer applied to at least portions of the first side of the polymer layer and a second resist layer applied to at least portions of the second side of the polymer layer; wherein:
the first resist layer defines a first aperture in the first metallic layer on the first side of the polymer layer;
the second resist layer defines a second aperture in the second metallic layer on the second side of the polymer layer, wherein the second aperture is opposite the first aperture; and
the polymer layer comprises a third aperture in alignment with the first aperture and the second aperture to define a via through the chassis.

2. The chassis of claim 1, wherein:
the polymer layer comprises a formable polymer formed into a three-dimensional shape.

3. The chassis of claim 1, wherein:
the first resist layer defines at least one antenna structure on the first side of the polymer layer; and
the second resist layer defines at least one antenna window structure on the second side of the polymer layer, opposite the antenna structure.

4. The chassis of claim 1, further comprising:
a touch pad disposed on the second side of the polymer layer; and
a capacitive sensor disposed on the first side of the polymer layer and coupled to the touch pad via a conductive trace extending through the via.

5. An electronic device, comprising:
a controller;
a chassis for an electronic device, comprising:
a polymer layer;
a first metallic layer deposited on a first side of the polymer layer; and
a second metallic layer deposited on a second side of the polymer layer;
wherein the first metallic layer or the second metallic layer comprises:
  a patch section that is not coated with a metallic layer; and
  at least one conductive strip defined within the patch section to define an antenna structure, wherein the at least one conductive strip is electrically coupled to the first metallic layer such that the first metallic layer functions as a ground plane for the antenna structure;
a first resist layer applied to at least portions of the first side of the polymer layer and a second resist layer applied to at least portions of the second side of the polymer layer; wherein:
the first resist layer defines a first aperture in the first metallic layer on the first side of the polymer layer;
the second resist layer defines a second aperture in the second metallic layer on the second side of the polymer layer, wherein the second aperture is opposite the first aperture; and
the polymer layer comprises a third aperture in alignment with the first aperture and the second aperture to define a via through the chassis.

6. The electronic device of claim 5, wherein:
the polymer layer comprises a formable polymer formed into a three-dimensional shape.

7. The electronic device of claim 5, wherein:
the first resist layer defines at least one antenna structure on the first side of the polymer layer; and the second resist layer defines at least one antenna window structure on the second side of the polymer layer, opposite the antenna structure.

8. The electronic device of claim 5, further comprising:
a touch pad disposed on the second side of the polymer layer; and
a capacitive sensor disposed on the first side of the polymer layer and coupled to the touch pad via a conductive trace extending through the via.

\* \* \* \* \*